(12) United States Patent
Byeon

(10) Patent No.: US 8,050,113 B2
(45) Date of Patent: Nov. 1, 2011

(54) CORE VOLTAGE DISCHARGER AND SEMICONDUCTOR MEMORY DEVICE WITH THE SAME

(75) Inventor: Sang-Jin Byeon, Kyoungki-do (KR)

(73) Assignee: Hynix Semiconductor, Inc. (KR)

( * ) Notice: Subject to any disclaimer, the term of this patent is extended or adjusted under 35 U.S.C. 154(b) by 0 days.

(21) Appl. No.: 13/023,739

(22) Filed: Feb. 9, 2011

(65) Prior Publication Data

US 2011/0128803 A1 Jun. 2, 2011

Related U.S. Application Data

(62) Division of application No. 12/005,506, filed on Dec. 26, 2007, now Pat. No. 7,907,462.

(30) Foreign Application Priority Data

Aug. 29, 2007 (KR) .............................. 2007-0087096

(51) Int. Cl.
*G11C 7/00* (2006.01)
*G11C 7/04* (2006.01)
*G11C 5/14* (2006.01)

(52) U.S. Cl. .............. 365/189.09; 365/189.11; 365/194; 365/205; 365/207; 365/208; 365/211; 365/226

(58) Field of Classification Search ............. 365/189.09, 365/205, 207, 208, 211, 226, 189.11, 194
See application file for complete search history.

(56) References Cited

U.S. PATENT DOCUMENTS

| | | | |
|---|---|---|---|
| 5,550,702 A | 8/1996 | Schmidt et al. | |
| 6,205,074 B1 | 3/2001 | Van Buskirk et al. | |
| 6,347,058 B1 | 2/2002 | Houghton et al. | |
| 6,453,218 B1 | 9/2002 | Vergis | |
| 6,608,790 B2 | 8/2003 | Tran et al. | |
| 6,717,880 B2 | 4/2004 | Jeong | |
| 6,735,137 B2 | 5/2004 | Jung et al. | |
| 6,982,916 B2 | 1/2006 | Tsang | |
| 7,009,904 B2 | 3/2006 | Kim | |
| 7,020,014 B2 | 3/2006 | Khouri et al. | |
| 7,020,043 B1 | 3/2006 | Lee | |
| 7,038,957 B2 | 5/2006 | Kwack et al. | |
| 7,158,430 B2 | 1/2007 | Byun | |
| 7,266,031 B2 | 9/2007 | Kim et al. | |
| 7,283,414 B1 | 10/2007 | So et al. | |
| 7,313,034 B2 | 12/2007 | Joo | |
| 7,417,903 B2 * | 8/2008 | Kim et al. | 365/189.09 |
| 7,447,100 B2 * | 11/2008 | Jang | 365/226 |
| 7,450,448 B2 * | 11/2008 | Do | 365/205 |
| 7,451,053 B2 | 11/2008 | Jeong | |
| 7,492,645 B2 * | 2/2009 | Kang et al. | 365/189.09 |
| 7,515,492 B2 * | 4/2009 | Seo | 365/205 |
| 7,567,469 B2 * | 7/2009 | Lee | 365/189.09 |

(Continued)

FOREIGN PATENT DOCUMENTS

JP 11-273346 10/1999

(Continued)

*Primary Examiner* — Trong Phan
(74) *Attorney, Agent, or Firm* — Blakely, Sokoloff, Taylor & Zafman

(57) ABSTRACT

A core voltage discharger is capable of adjusting an amount of a current discharged according to temperature. The discharger for decreasing a level of a predetermined voltage receives temperature information from an on die thermal sensor and discharges a different amount of current in response to the temperature information.

10 Claims, 9 Drawing Sheets

U.S. PATENT DOCUMENTS

| | | | |
|---|---|---|---|
| 7,580,303 B2 | 8/2009 | Nishimura et al. | |
| 7,586,796 B2 * | 9/2009 | Choi | 365/189.09 |
| 7,773,432 B2 * | 8/2010 | Byeon | 365/189.09 |
| 7,876,635 B2 * | 1/2011 | Oh | 365/205 |
| 7,907,462 B2 * | 3/2011 | Byeon | 365/211 |
| 2006/0267630 A1 | 11/2006 | Matsui | |
| 2006/0268630 A1 | 11/2006 | Park et al. | |
| 2007/0070757 A1 | 3/2007 | Jang | |
| 2007/0280330 A1 | 12/2007 | Jeong et al. | |

FOREIGN PATENT DOCUMENTS

| | | |
|---|---|---|
| JP | 2006-286163 | 10/2006 |
| JP | 2006-309916 | 11/2006 |
| KR | 1020030047013 A | 6/2003 |
| KR | 1020030053923 A | 7/2003 |
| KR | 10-2006-0124755 A | 12/2006 |

* cited by examiner

US 8,050,113 B2

1

CORE VOLTAGE DISCHARGER AND SEMICONDUCTOR MEMORY DEVICE WITH THE SAME

The present patent application is a Divisional application claiming the benefit of application Ser. No. 12/005,506, filed Dec. 26, 2007 now U.S. Pat. No. 7,907,462.

CROSS-REFERENCE TO RELATED APPLICATIONS

The present invention claims priority to Korean patent application number 10-2007-0087096, filed on Aug. 29, 2007, which is incorporated by reference in its entirety.

BACKGROUND OF THE INVENTION

The present invention relates to a discharger for discharging a predetermined voltage or a core voltage (VCORE) and a semiconductor memory device including the same, and more particularly to a discharger capable of discharging a different amount of current according to temperature and a semiconductor memory device including the same.

As is well known, a dynamic random access memory (DRAM) amplifies a signal using a bit line sense amplifier in a data read operation, and uses an overdriving scheme in an initial enabling period of the bit line sense amplifier in order to improve a sensing speed.

FIG. 1 is a signal timing diagram illustrating an overdriving scheme in a conventional bit line sensing operation. An amplification process and an overdriving operation of a bit line sense amplifier will be described below with reference to FIG. 1. In general, when a bitline isolation signal BIS is activated, the cell array and the bitline sense amplifier are electrically coupled to each other. When the bitline isolation signal BIS is deactivated, the cell array and the bitline sense amplifier are electrically decoupled form each other. Moreover, when a bitline equalization signal BLEQ is activated, the bitline pair BL and /BL is precharged to the precharge voltage VBLP.

A charge sharing occurs between a cell and a precharged bit line when a word line WL of the selected memory cell is enabled. Therefore, a slight voltage difference (dV) occurs between a bit line BL and a bit line bar BLB. This period is represented by a reference numeral "102" in FIG. 1.

Thereafter, a bit line sense amplifier is enabled. The voltage difference is widened, so that the bit line BL and the bit line bar BLB are set to the levels of a core voltage VCORE and a ground voltage VSS, respectively. The bit line sense amplifier is enabled by applying voltages to driving its voltage lines RTO and SB. More specifically, the bit line sense amplifier is enabled by applying the core voltage VCORE and the ground voltage VSS to the driving voltage lines RTO and SB, and amplifies voltages applied to the bit lines BL and BLB.

As described above, the bit line sense amplifier is overdriven by applying a high voltage (generally, a power supply voltage VDD) higher than a core voltage VCORE to the driving voltage line RTO during an initial enabling period. This overdriving period is represented by a reference numeral "103" in FIG. 1. A width of the overdriving period is determined by a pulse width of an overdriving pulse.

FIG. 2 is a circuit diagram of a conventional memory core.

Referring to FIG. 2, a conventional memory core includes a bit line sense amplifier 210, a sense amplifier driver 220, and a core voltage discharger 230.

The bit line sense amplifier 210 amplifies a voltage difference between a bit line BL and a bit line bar BLB. The bit line

2 sense amplifier 210 is a latch type amplifier having two inverters cross-coupled to each other. A power supply voltage is applied to the bit line sense amplifier 210 through driving voltage lines RTO and SB.

The sense amplifier driver 220 includes transistors T1 and T2 that are respectively turned on when control signals SAP and SAN are activated. The sense amplifier driver 220 applies a core voltage VCORE or a power supply voltage VDD to a driving voltage line RTO, and a ground voltage VSS to a driving voltage line SB. In an initial enabling period, a transistor T3 is turned on in response to an overdriving pulse VDD_ON to supply a power supply voltage VDD to the driving voltage line RTO. The period where the high voltage VDD is supplied to the driving voltage line RTO is determined by a pulse width of the overdriving pulse VDD_ON. When the initial overdriving operation is finished, the transistor T3 is turned off and a transistor 14 is turned on. Thus, a core voltage VCORE is supplied to the driving voltage line RTO so that the bit line sense amplifier 210 is driven.

When the overdriving operation is finished and the core voltage VCORE begins to be supplied to the driving voltage line RTO, a current flows into a core voltage terminal from the driving voltage line RTO by the power supply voltage VDD previously applied to the driving voltage line RTO, thereby increasing a level of the core voltage VCORE. Therefore, a core voltage discharger 230 is required which can drop the increased level of the core voltage VCORE to the original level.

FIG. 3 is a graph illustrating the core voltage VCORE increased by the overdriving operation.

In FIG. 3, ΔV1 represents an increment of the core voltage VCORE, which is increased by a current flowing into the core voltage terminal by the power supply voltage previously applied to the driving voltage line RTO. In the absence of the core voltage discharger 230, the increased core voltage VCORE is slightly discharged by a leakage current or a small transistor, which is intentionally provided in the core voltage driver so as to stabilize the level of the core voltage VCORE. Accordingly, it is difficult to maintain the level of the core voltage VCORE to a target level TARGET CORE thereby not reaching an actual level ACTUAL CORE of the core voltage VCORE. In FIG. 3, ΔV2 represents an amount of a voltage discharged by the leakage current or the small transistor. That is, in the absence of the core voltage discharger 230, the level of the core voltage VCORE is not stably maintained. Instead, the level of the core voltage VCORE increases.

FIG. 4 is a schematic circuit diagram of a conventional core voltage discharger.

Referring to FIG. 4, the conventional core voltage discharger 230 discharges a core voltage VCORE by comparing the core voltage VCORE with a reference voltage VREFC. A level of the reference voltage VREFC may be set to a level substantially equal to the core voltage VCORE or half the core voltage VCORE. FIG. 4 illustrates the case where the level of the reference voltage VREFC is half the core voltage VCORE.

A discharge enable signal DC_EN has a logic high level in synchronization with a falling edge of an overdriving pulse VDD_ON indicating an overdriving period. The core voltage discharger 230 operates during the period in which the discharge enable signal DC_EN is at the logic high level.

When the discharge enable signal DC_EN becomes the logic high level, a transistor N3 is turned on to enable the core voltage discharger 230 to perform the comparison operation. The core voltage discharger 230 compares a voltage level of a half core voltage node HFVCORE with a voltage level of a reference voltage node VREFC, which corresponds to half the target voltage of the core voltage VCORE.

The node HFVCORE has a voltage level higher than the reference voltage VREFC when the core voltage VCORE is increased by the overdriving operation. Therefore, a transistor N2 is turned on stronger than a transistor N1, and a node B has a voltage level lower than a node A. A transistor P4 is strongly turned on and a voltage of a node DC_CTRL increases. A discharge transistor N5 is turned on by the increased voltage level of the node DC_CTRL, and the voltage level of the core voltage VCORE is dropped by a current flowing from a core voltage terminal to a ground voltage terminal due to the transistor N5.

That is, when the current core voltage VCORE is higher than the target core voltage VCORE, the core voltage discharger 230 drops the level of the core voltage VCORE by discharging a current from the core voltage terminal.

A level variation of the core voltage VCORE by the discharge operation of the conventional core voltage discharger 230 will be described with reference to FIGS. 5A and 5B. Transistors P1 and P2, transistors P3 and P4 and transistors N8 and N9 are respectively formed current mirror. The transistors N6 and N7 are formed an active load. When the discharge enable signal DC_EN becomes Low, the transistors N4 is turned on to supply a ground voltage VSS to the node DC_CTRL.

FIG. 5A is a graph illustrating the level variation of the core voltage VCORE when the core voltage VCORE is excessively discharged by variation of process, voltage, and temperature (PVT). Referring to FIG. 5A, the level of the core voltage VCORE is excessively dropped due to the excessive discharge of the core voltage VCORE in an initial stage, and thus a core voltage driver again operates to increase the level of the core voltage VCORE. Therefore, a ringing phenomenon is generated to fluctuate the level of the core voltage VCORE.

FIG. 5B is a graph illustrating the level variation of the core voltage VCORE when the core voltage VCORE is not sufficiently discharged by the variation of the PVT. A target level of the core voltage VCORE is not achieved until a discharge operation of the core voltage discharger 230 is finished. In this situation, the level of the core voltage gradually increases by repeating an overdriving operation.

The core voltage may be excessively or insufficiently discharged by the temperature variation, thereby causing the problems as illustrated in FIGS. 5A and 5B. However, since the conventional core voltage discharger 230 has no temperature dependence, the core voltage is excessively or insufficiently discharged by the temperature variation.

SUMMARY OF THE INVENTION

Embodiments of the present invention are directed to providing a core voltage discharger capable of adjusting an amount of a current discharged according to temperature, and a semiconductor memory device including the same.

In one embodiment, a discharger for decreasing a level of a predetermined voltage receives temperature information from an on die thermal sensor and discharges a different amount of current in response to the temperature information.

In another embodiment, a core voltage discharger for decreasing a level of a core voltage increased after an overdriving operation receives temperature information from an on die thermal sensor and discharges an amount of current in response to the temperature information.

In a further embodiment, a semiconductor memory device includes a bit line sense amplifier configured to amplify a voltage difference between a pair of bit lines, a sense amplifier driver configured to supply a driving voltage to the bit line sense amplifier so as to enable the bit line sense amplifier, wherein a high voltage for overdriving is supplied at an initial enable stage and thereafter a core voltage is supplied as the driving voltage, an on die thermal sensor configured to measure temperature to output temperature information, and a core voltage discharger configured to discharge a core voltage so as to decrease an increased level of the core voltage after an overdriving operation, wherein an amount of discharged current changes as a function of the temperature information.

DESCRIPTION OF SPECIFIC EMBODIMENTS

Hereinafter, a core voltage discharger in accordance with the present invention will be described in detail with reference to the accompanying drawings.

Figure 6:
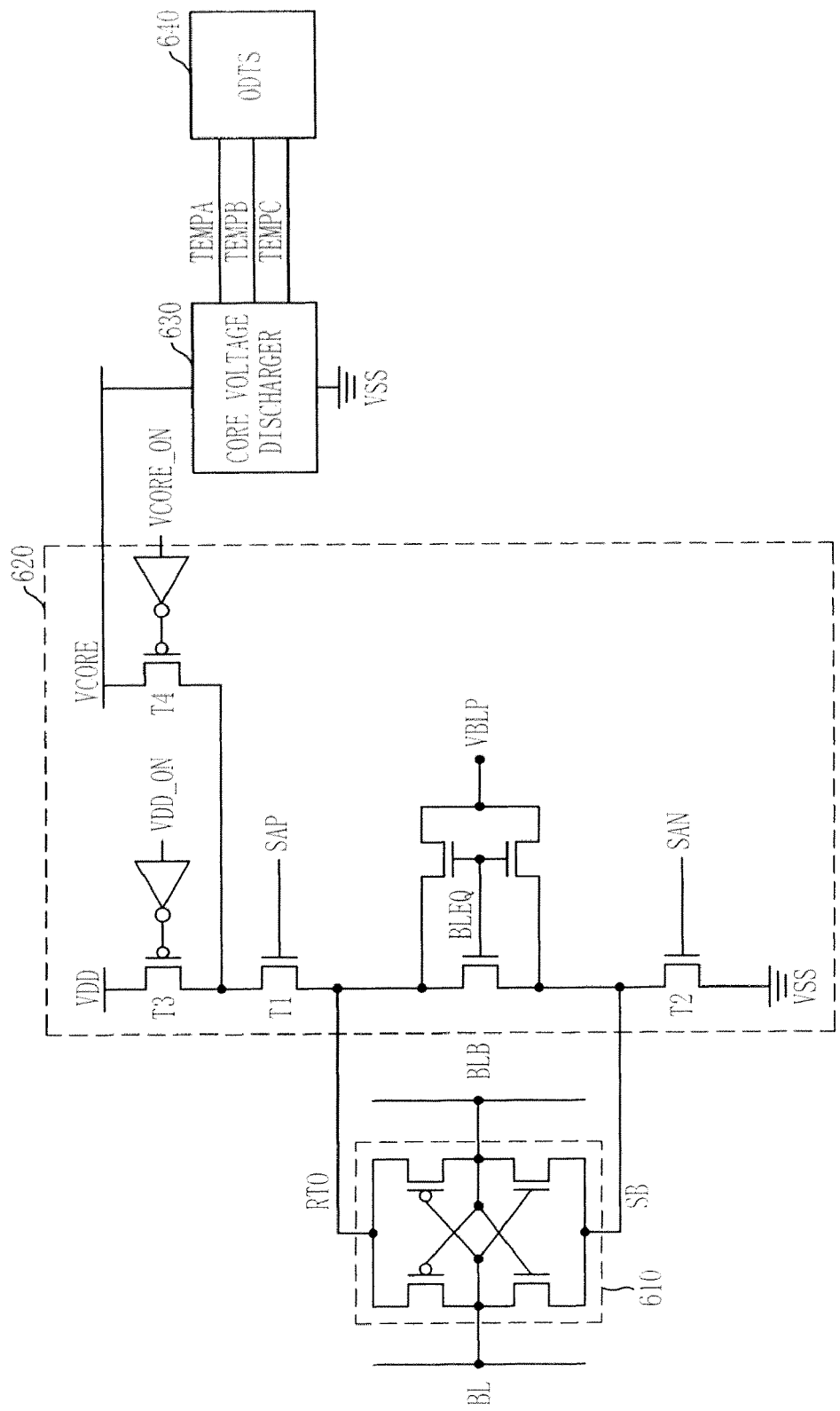
FIG. 6 is a circuit diagram of a semiconductor memory device in accordance with an embodiment of the present invention.

FIG. 6 is a circuit diagram of a semiconductor memory device in accordance with an embodiment of the present invention.

Referring to FIG. 6, the semiconductor memory device in accordance with the present invention includes a bit line sense amplifier 610, a sense amplifier driver 620, a core voltage discharger 630, and an on-die thermal sensor (ODTS) 640. The bit line sense amplifier 610 amplifies a voltage difference between a pair of bit lines BL and BLB. The sense amplifier driver 620 supplies a driving voltage to the bit line sense amplifier 610 so as to enable the bit line sense amplifier 610. The sense amplifier driver 620 supplies a high voltage VDD for overdriving at an initial stage and then supplies a core voltage VCORE. The ODTS 640 measures a temperature to output temperature information TEMPA, TEMPB and TEMPC. The core voltage discharger 630 discharges the core voltage VCORE to decrease an increased level of the core voltage VCORE after the overdriving. An amount of current discharged by the core voltage discharger 630 is different according to the temperature information TEMPA, TEMPB and TEMPC.

Since the bit line sense amplifier 610 and the sense amplifier driver 630 have been described in the background of the invention, their detailed description will be omitted herein. The ODTS 640 and the core voltage discharger 630 will be described with reference to the accompanying drawings.

Figure 7:
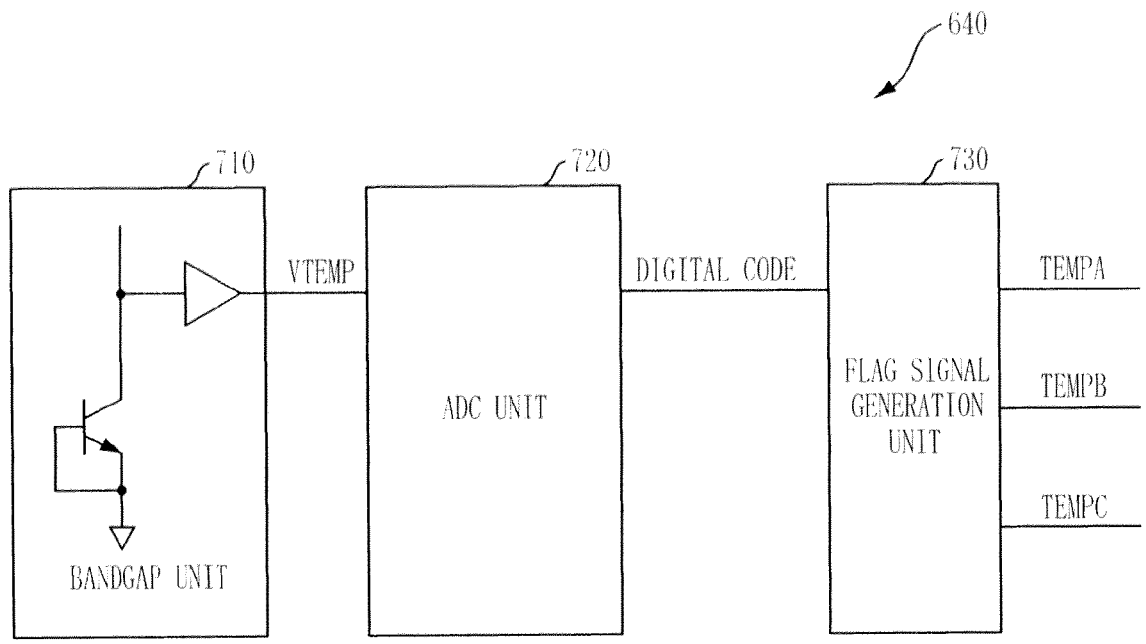
FIG. 7 is a block diagram of an on die thermal sensor of FIG. 6.

FIG. 7 is a block diagram of the ODTS 640 of FIG. 6

The ODTS 640 includes a bandgap unit 710, an analog-to-digital conversion (ADC) unit 720, and a flag signal generation unit 730. The bandgap unit 710 outputs a voltage corresponding to temperature. The ADC unit 720 converts the voltage outputted from the bandgap unit 710 into a digital code. The flag signal generation unit 730 receives the digital code to generate a plurality of flag signals, which are enabled at a predetermined temperature.

The bandgap unit 710 detects the temperature using a bipolar junction transistor (BJT), a variation of a base-emitter voltage (Vbe) of which is about −1.8 mV/° C., among bandgap circuits which are not influenced by temperature or power supply voltage. The bandgap unit 710 amplifies the base-emitter voltage (Vbe) of the BJT, which is minutely varied, and outputs a voltage VTEMP corresponding to the temperature. That is, as the temperature increases, the base-emitter voltage (Vbe) of the bipolar junction transistor BJT decreases.

The ADC unit 720 converts the voltage VTEMP outputted from the bandgap unit 610 into the digital code. A tracking analog-to-digital converter may be used as the ADC unit 720.

The flag signal generation unit 730 decodes the digital code to output the plurality of flag signals TEMPA, TEMPB and TEMPC, which indicate temperature periods.

Figure 8:
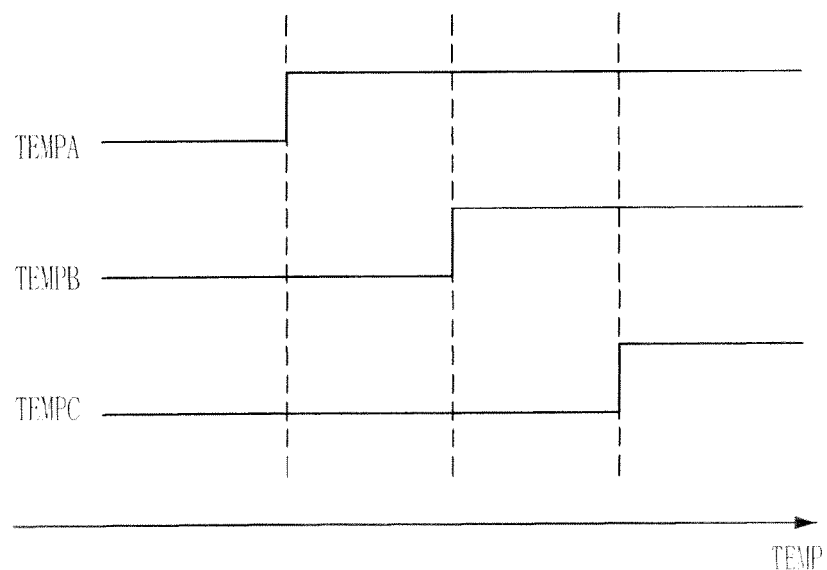
FIG. 8 is a signal timing diagram of flag signals (TEMPA, TEMPB, TEMPC).

The flag signals TEMPA, TEMPB and TEMPC are enabled when temperature is higher than a predetermined temperature. FIG. 8 is a signal timing diagram illustrating the enabling of the flag signals TEMPA, TEMPB and TEMPC. The flag signals TEMPA, TEMPB and TEMPC are enabled in turn as the temperature increases. When TEMPA="low", TEMPB="low", and TEMPC="low", it represents the lowest temperature period. Meanwhile, when TEMPA="high", TEMPB="high" and TEMPC="high", it represents the highest temperature period.

The flag signals TEMPA, TEMPB and TEMPC of the ODTS are also used for adjusting a refresh cycle of the memory device according to the temperature variation.

Figure 9:
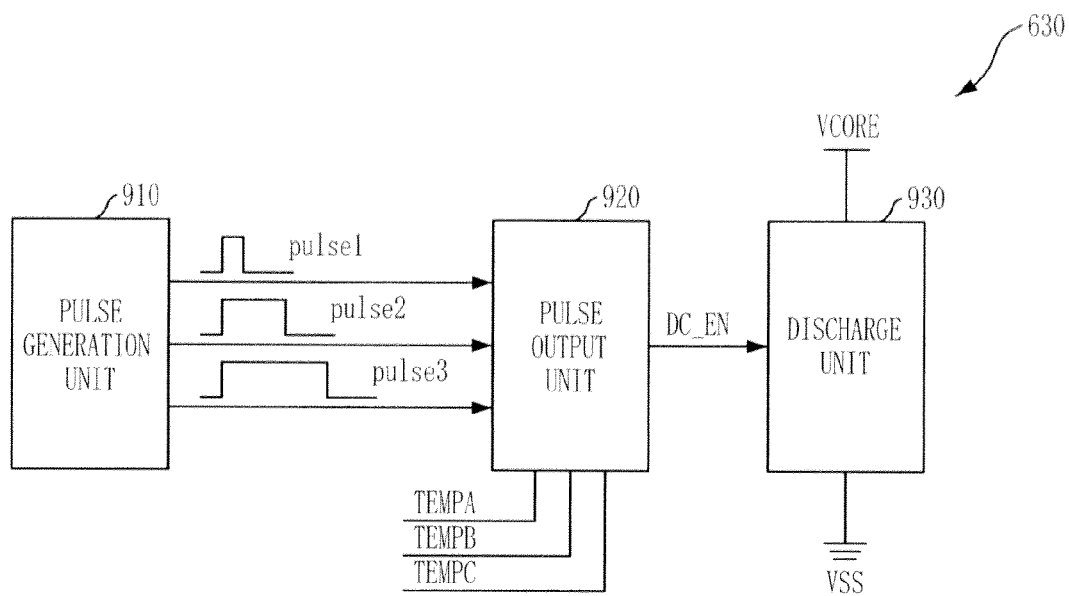
FIG. 9 is a block diagram of a core voltage discharger in accordance with an embodiment of the present invention.

FIG. 9 is a block diagram of the core voltage discharger 630 in accordance with an embodiment of the present invention.

The core voltage discharger 630 includes a pulse generation unit 910, a pulse output unit 920, and a discharge unit 930. The pulse generation unit 910 generates a plurality of pulse signals PULSE1, PULSE2 and PULSE3 having different pulse widths. The pulse output unit 920 outputs one pulse signal DC_EN among the plurality of pulse signals PULSE1, PULSE2 and PULSE3 in response to temperature information TEMPA, TEMPB and TEMPC. The discharge unit 930 is enabled by the pulse signal DC_EN outputted from the pulse output unit 920 and discharges the core voltage VCORE.

One pulse signal of the pulse signals PULSE1, PULSE2 and PULSE3 having the different pulse widths, which are generated from the pulse generation unit 910, is selected according to the temperature information TEMPA, TEMPB and TEMPC. The discharge unit 930 is driven by the selected pulse signal DC_EN and changes an amount of a current discharged from the core voltage VCORE.

Figure 1:
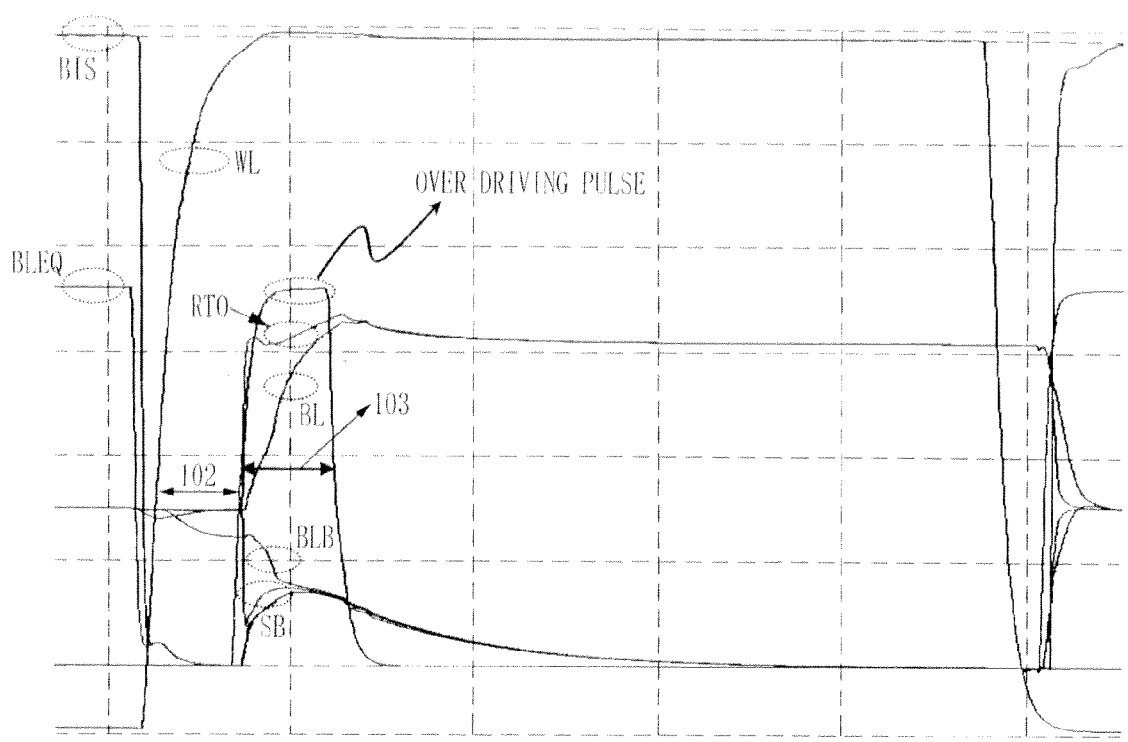
FIG. 1 is a signal timing diagram illustrating an overdriving scheme in a conventional bit line sensing operation.
Figure 2:
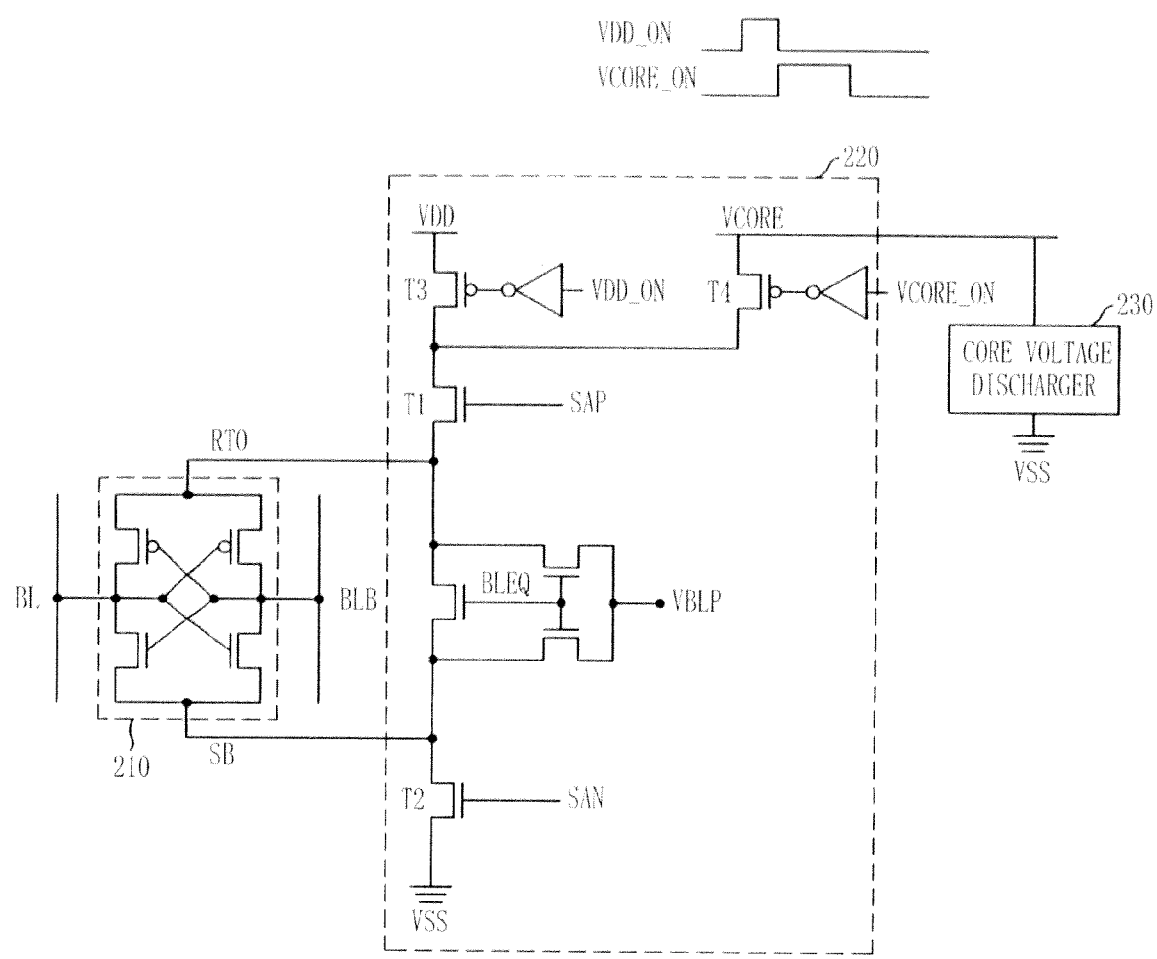
FIG. 2 is a circuit diagram of a conventional memory core.
Figure 3:
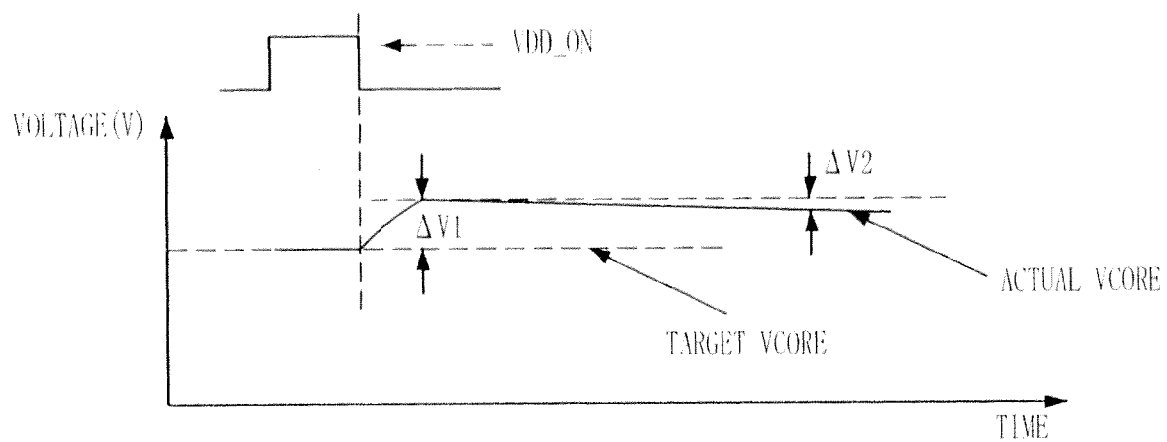
FIG. 3 is a graph illustrating a core voltage increased by an overdriving operation.
Figure 4:
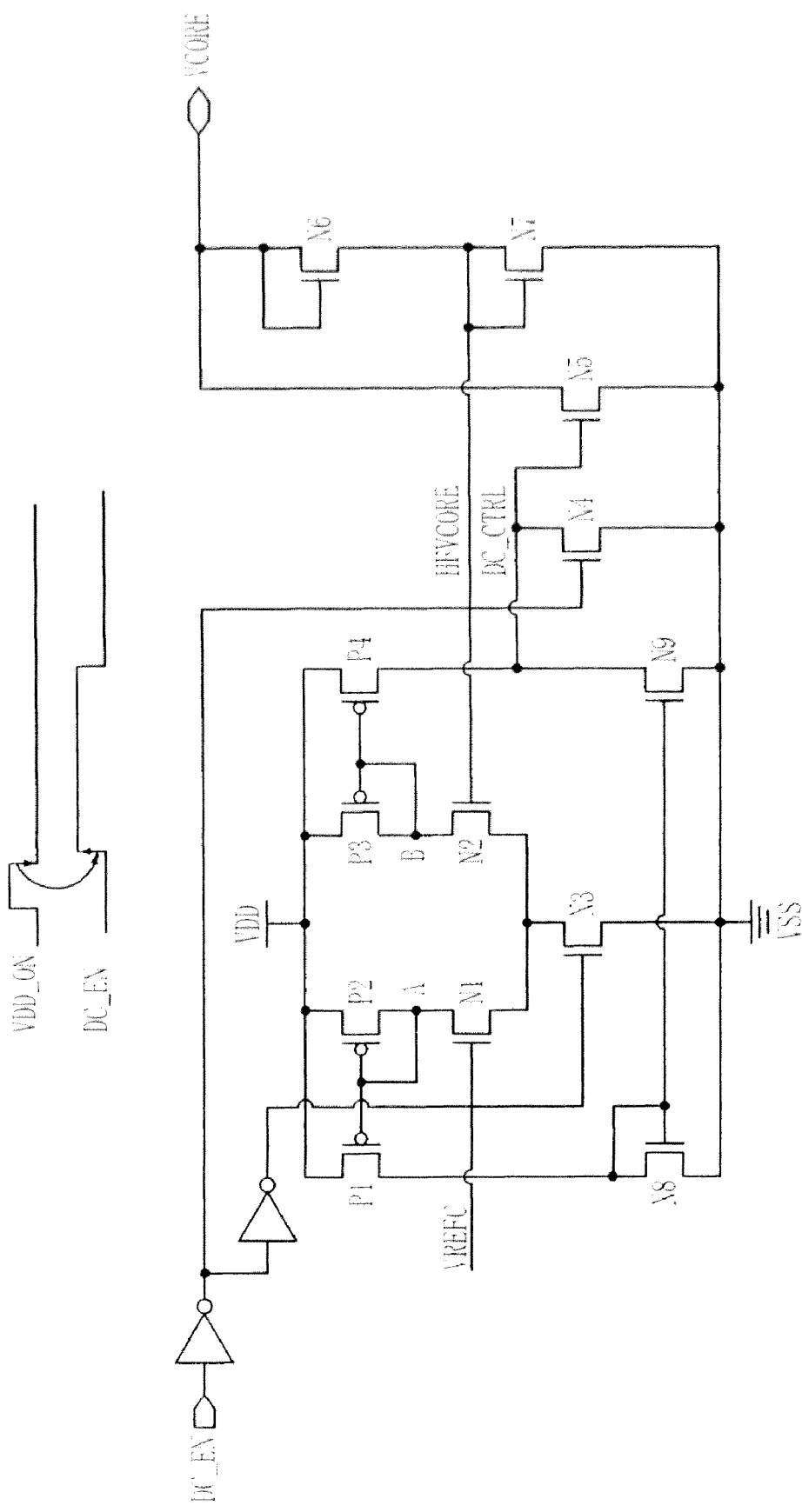
FIG. 4 is a schematic circuit diagram of a conventional core voltage discharger.
Figure 5A:
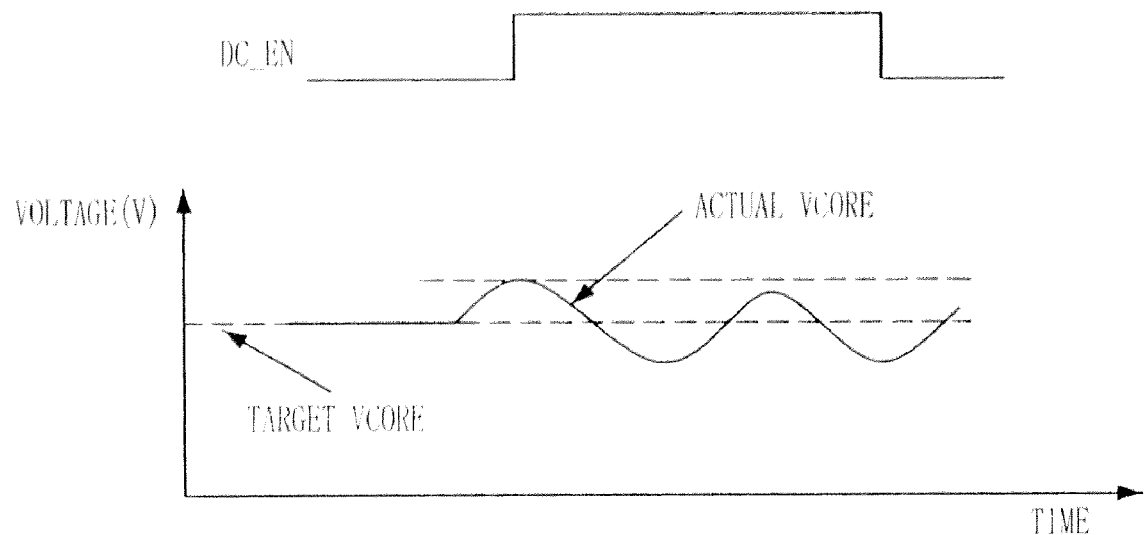
FIG. 5A is a graph illustrating the level variation of the core voltage when the core voltage is excessively discharged by variation of PVT.
Figure 5B:
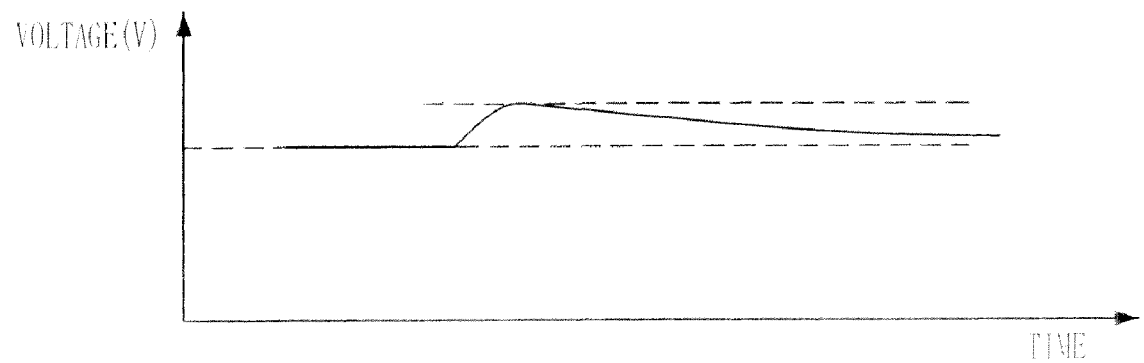
FIG. 5B is a graph illustrating the level variation of the core voltage when the core voltage is not sufficiently discharged by the variation of the PVT.

Since the discharge unit 930 enabled by the pulse signal DC_EN may be configured the same as the conventional core voltage discharger of FIG. 4, its detailed description will be omitted.

The discharge unit 930 must discharge the core voltage VCORE after the overdriving operation. Accordingly, the pulse signals PULSE1, PULSE2, PULSE3 and DC_EN are enabled when the overdriving operation is finished.

The core voltage discharger 630 of FIG. 9 adjusts an amount of current to be discharged using the temperature information TEMPA, TEMPB and TEMPC received from the ODTS 640. The core voltage discharger 630 is used not only for discharging the core voltage VCORE in the memory device and but also for discharging a predetermined voltage through being applied to various circuits and systems except for the memory device. However, the circuits and systems using the core voltage discharger 630 must include the ODTS 640 in order to provide the temperature information TEMPA, TEMPB and TEMPC to the core voltage discharger 630.

Figure 10:
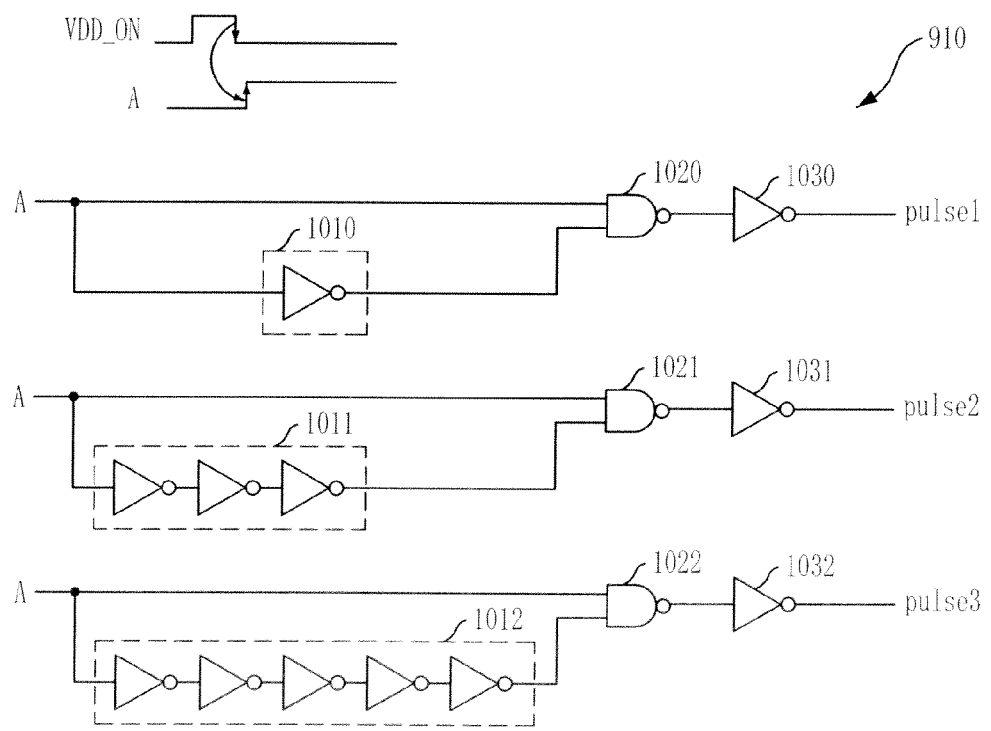
FIG. 10 is a schematic circuit diagram of a pulse generating unit of FIG. 9.

FIG. 10 is a schematic circuit diagram of the pulse generation unit 910 of FIG. 9.

The pulse generation unit 910 performs a logic operation on an input signal A, which is activated at the end of the overdriving period, and a delayed input signal to generate the plurality of pulse signals PULSE1, PULSE2 and PULSE3. Since the delay value of the input signal A is differently applied according to the pulse signals PULSE1, PULSE2 and PULSE3, the pulse widths of the pulse signals PULSE1, PULSE2 and PULSE3 are different.

The pulse generation unit 910 includes delays 1010, 1011 and 1012 configured with a plurality of inverters connected in series to delay the input signal A, NAND gates 1020, 1021 and 1022 configured to receive the input signal A and the delayed signal, and the plurality of inverters 1030, 1031 and 1032 configured to receive output signals of the NAND gates 1020, 1021 and 1022 to output the pulse signals PULSE1, PULSE2 and PULSE3.

The delays 1010, 1011 and 1012 include an odd number of inverters. Different delay values are set according to the pulse signals PULSE1, PULSE2 and PULSE3. The difference of the delay value is indicated through the number of the inverters in FIG. 10. Although the inverter is used as the delay element in the above-described embodiment, various other means such as a resistance capacitance (RC) delay can also be used only if the delay value is differently set according to the pulse signals PULSE1, PULSE2 and PULSE3.

Figure 11:
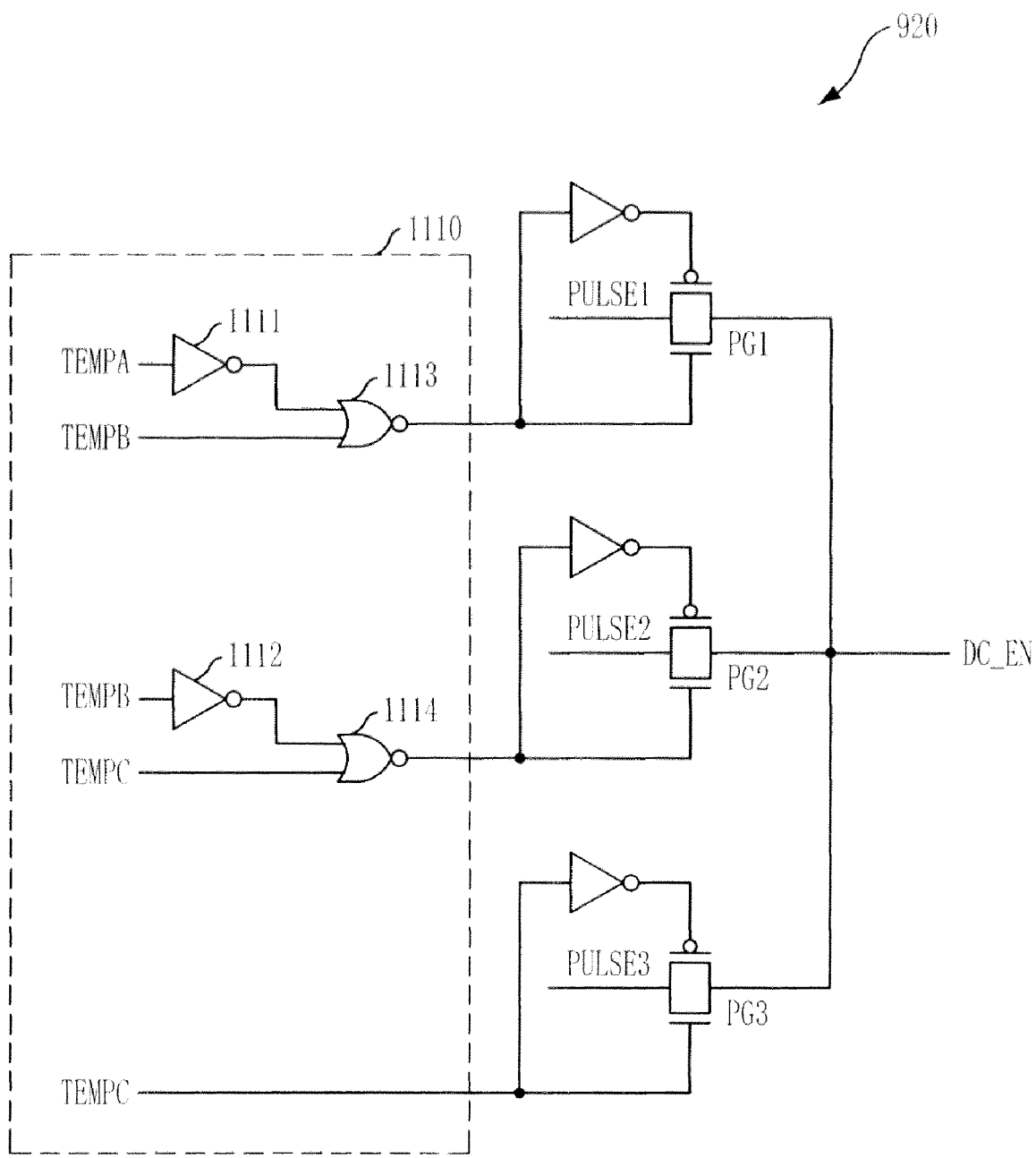
FIG. 11 is a schematic circuit diagram of a pulse output unit of FIG. 9.

FIG. 11 is a schematic circuit diagram of the pulse output unit 920 of FIG. 9.

Referring to FIG. 11, the pulse output unit 920 includes a plurality of pass gates PG1, PG2 and PG3 and a controller 1110. The pass gates PG1, PG2 and PG3 receive the pulse signals PULSE1, PULSE2 and PULSE3, respectively. The controller 1110 receives a plurality of flag signals TEMPA, TEMPB and TEMPC to control an ON/OFF operation of the plurality of pass gates PG1, PG2 and PG3.

The pass gates PG1, PG2 and PG3 may include a PMOS transistor and an NMOS transistor.

The controller 1110 includes inverters 1111 and 1112 receiving the flag signals TEMPA and TEMPB corresponding to the pass gates PG1 and PG2, and NOR gates 1113 and 1114 receiving output signals of the inverters 1111 and 1112 and the flag signals TEMPB and TEMPC. The pass gates PG1 and PG2 are controlled by the output signals of the NOR gates 1113 and 1114. However, the pass gate PG3 corresponding to highest temperature is directly controlled by the corresponding flag signal TEMPC.

The pass gates PG1, PG2 and PG3 correspond to the flag signals TEMPA, TEMPB and TEMPC, respectively. The controller 1110 turns on the pass gates PG1, PG2 and PG3 when the flag signals TEMPA, TEMPB and TEMPC respectively corresponding to the pass gates PG1, PG2 and PG3 are enabled. That is, a "high" level signal is outputted from the NOR gate 1113 to turn on the pass gate PG1 when the flag signal TEEMPA is enabled. However, the pass gates PG1, PG2 and PG3 are turned off when an upper flag signal that is enabled at a temperature higher than the flag signal corresponding to each of the pass gates is enabled. That is, when the flag signal TEMPA is enabled and the flag signal TEMPB is enabled, the output signal of the NOR gate 1113 becomes a "low" level. As a result, the pass gate PG1 is not turned on. This is done because the pass gate PG2 must be turned on. Therefore, since there is no upper flag signal than the flag signal TEMPC, which is enabled at the highest temperature, the pass gate PG3 corresponding to the flag signal TEMPC always turned on when the flag signal TEMPC is enabled.

When the flag signals TEMPA, TEMPB and TEMPC are respectively "high", "low", and "low", the pass gate PG1 is turned on. When the flag signals TEMPA, TEMPB and TEMPC are respectively "high", "high", and "low", the pass gate PG2 is turned on. When the flag signals TEMPA, TEMPB and TEMPC are respectively "high", "high", and "high", the pass gate PG3 is turned on.

The pulse width of the pulse signal DC_EN is in proportion to the temperature, when the pass gates PG1, PG2 and PG3 receive the pulse signals PULSE1, PULSE2 and PULSE3, respectively. However, the pulse width of the output pulse signal DC_EN is in inverse proportion to the temperature, when the pass gates PG3, PG2 and PG1 receive the pulse signals PULSE1, PULSE2 and PULSE3, respectively.

Since the pulse width of the output pulse signal DC_EN determines an operation time of the discharge unit 930, the core voltage discharger of FIG. 9 can adjust such that the amount of the discharged current is in proportion or in inverse proportion to the temperature.

The amount of the current to be discharged by the core voltage discharger of FIG. 9 may be in proportion or in inverse proportion to the temperature according to manufacturing processes, characteristics of the used transistors, and circuit design. The discharger of the present invention can satisfy such demand.

In accordance with the present invention, it is possible to adjust the amount of the current to be discharged by the core voltage discharger according to the temperature. Accordingly, the core voltage discharger of the present invention adjusts the amount of the current to be discharged from the core voltage terminal to the ground voltage terminal based on the temperature, thereby stabilizing the level of the core voltage to the target level.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a bit line sense amplifier configured to amplify a voltage difference between a pair of bit lines;
   a sense amplifier driver configured to supply a driving voltage to the bit line sense amplifier so as to enable the bit line sense amplifier, wherein a high voltage for overdriving is supplied at an initial enable stage and thereafter a core voltage is supplied as the driving voltage;
   an on die thermal sensor configured to measure temperature to output temperature information; and
   a core voltage discharger configured to discharge a core voltage so as to decrease an increased level of the core voltage after an overdriving operation, wherein an amount of discharged current changes as a function of the temperature information.

2. The semiconductor memory device as recited in claim 1, wherein the core voltage discharger determines a discharge time according to the temperature information to discharge the amount of the current.

3. The semiconductor memory device as recited in claim 1, wherein the core voltage discharger includes:
   a pulse generation unit configured to generate a plurality of pulse signals having different pulse widths;
   a pulse output unit configured to output one of the plurality of pulse signals according to the temperature information; and
   a discharge unit configured to be enabled by the pulse signal outputted from the pulse output unit to discharge the core voltage.

4. The semiconductor memory device as recited in claim 3, wherein the plurality of pulse signals are enabled at an end of the overdriving operation.

5. The semiconductor memory device as recited in claim 3, wherein the pulse generation unit performs a logic operation on an input signal, which is activated at an end of the overdriving operation, and a delayed input signal to generate the plurality of pulse signals,
   wherein a delay value of the input signal is differently applied according to the plurality of pulse signals.

6. The semiconductor memory device as recited in claim 3, wherein the pulse output unit includes:
   a plurality of pass gates configured to receive the plurality of pulse signals, respectively; and
   a controller configured to receive the temperature information corresponding to a plurality of flag signals, which are enabled at a predetermined temperature, to control an ON/OFF operation of the plurality of pass gates.

7. The semiconductor memory device as recited in claim 6, wherein the plurality of pass gates respectively correspond to the plurality of flag signals, and the controller turns on the pass gates when the flag signals corresponding to the pass gates are enabled.

8. The semiconductor memory device as recited in claim 7, wherein the controller turns off the pass gates when an upper flag signal, which is enabled at higher temperature than the corresponding flag signals, is enabled.

9. The semiconductor memory device as recited in claim 1, wherein the on die thermal sensor includes:
   a bandgap unit configured to output a temperature information voltage corresponding to temperature;
   an analog-to-digital conversion unit configured to convert the temperature information voltage into a digital code; and
   a flag signal generation unit configured to receive the digital code to generate a plurality of flag signals, which are enabled at predetermined temperature.

10. The semiconductor memory device as recited in claim 1, wherein the high voltage is a power supply voltage supplied from an external power supply.

* * * * *